United States Patent
Bois et al.

(10) Patent No.: US 7,238,892 B2
(45) Date of Patent: Jul. 3, 2007

(54) PRINTED CIRCUIT BOARD INCLUDING PADS WITH VACANCIES

(75) Inventors: Karl J. Bois, Fort Collins, CO (US); David W. Quint, Fort Collins, CO (US); Michael Tsuk, Arlington, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/188,481

(22) Filed: Jul. 25, 2005

(65) Prior Publication Data
US 2007/0017693 A1 Jan. 25, 2007

(51) Int. Cl.
*H05K 1/16* (2006.01)
(52) U.S. Cl. .................... 174/260; 174/262
(58) Field of Classification Search ............. 174/262, 174/264, 265, 266, 260, 261; 361/792, 793, 361/794, 795
See application file for complete search history.

(56) References Cited

U.S. PATENT DOCUMENTS

| | | | |
|---|---|---|---|
| 5,304,743 A | * | 4/1994 | Sen et al. ............... 174/262 |
| 5,319,159 A | * | 6/1994 | Watanabe et al. ........ 174/262 |
| 5,421,083 A | * | 6/1995 | Suppelsa et al. .......... 29/852 |
| 5,949,030 A | * | 9/1999 | Fasano et al. ........... 174/262 |
| 6,762,368 B2 | * | 7/2004 | Saputro et al. .......... 174/260 |
| 7,084,354 B2 | * | 8/2006 | Boggs et al. ............ 174/262 |

FOREIGN PATENT DOCUMENTS

JP 0200401455 A * 1/2004

OTHER PUBLICATIONS

D. Buysse, "Terminal blocks: Through-hole reflow technology makes the grade," Oct. 2004, 4 pp. [Online] http://connectorspecifier.printthis.clickability.com/pt/cpt?action=cpt &title=Terminal+bloc... .
L. Ritchey, "Anatomy of a Plated Through Hole," Aug. 30, 2001, 5 pp.

* cited by examiner

Primary Examiner—Ishwar (I. B.) Patel

(57) ABSTRACT

Methods and apparatuses for affecting the frequency behavior of connections within a printed circuit board or an integrated circuit are disclosed. Some embodiments include a printed circuit board comprising, a plurality of conductive layers each comprising at least one conductive pad, where each conductive pad on the conductive layers includes a vacancy, and an insulating material disposed about the conductive layers such that the vacancies are at least partially filled with the insulating material.

15 Claims, 6 Drawing Sheets

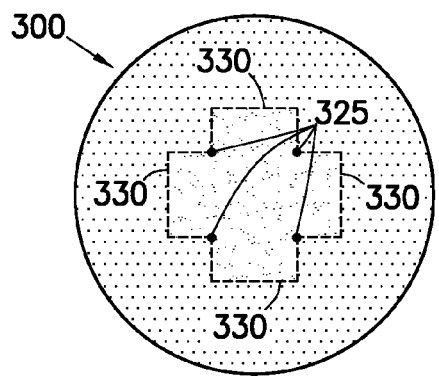
FIGURE 3A
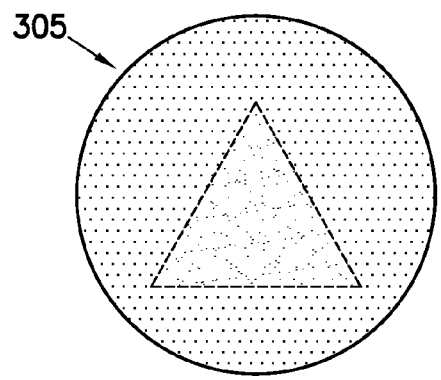
FIGURE 3B
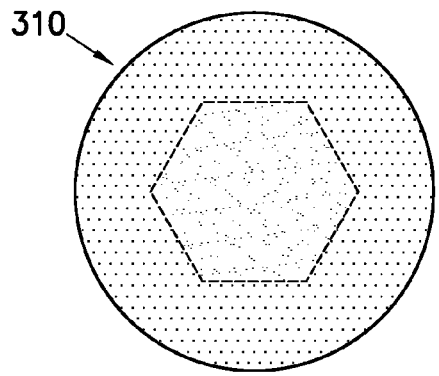
FIGURE 3C
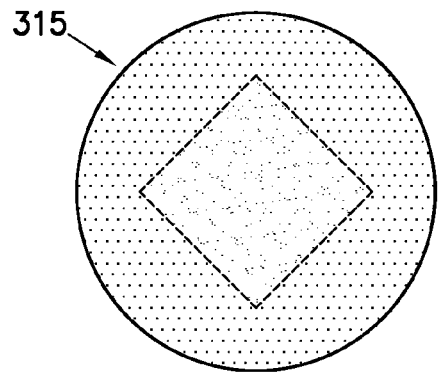
FIGURE 3D
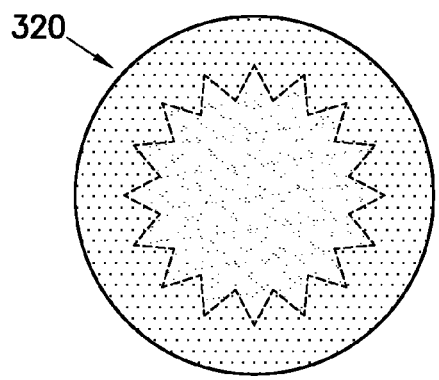
FIGURE 3E
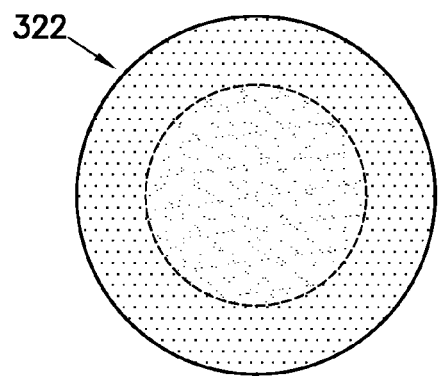
FIGURE 3F
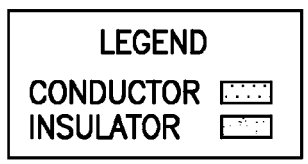

PRINTED CIRCUIT BOARD INCLUDING PADS WITH VACANCIES

BACKGROUND

Virtually every electronic device includes one or more varieties of printed circuit boards (PCBs). PCBs are relatively thin, layered substrates upon which integrated circuits and other electronic components are attached. A printed circuit board typically includes a plurality of electrically conductive and insulating layers arranged in a sandwich-like fashion. Conductive layers generally have conductive paths or traces, isolated from one another by the insulating material of the insulating layers, and routed within a plane. These traces are generally designed to electrically contact conductive portions of the electronic components mounted on the PCB, forming electrical interconnects. Insulating layers electrically isolate these conductive paths from one another. The principle structure of conductive traces and layers of insulating material is also used on a smaller scale within a packaged microchip having a PCB-like package substrate.

In order to make connection between two or more conductive layers of a PCB, or in order to make connection between an electrical component mounted on the PCB, a plated through hole connection is used. Plated through hole connections are formed by drilling through two or more layers of the PCB in a direction normal to the major surface of the PCB. This drilling action leaves a vacant cavity or barrel, the periphery of which is coated with conductive material to form an electrical connection between conductive layers along the cavity. In addition to providing a electrical connection between conductive layers of the PCB, the plated through hole connections offer a greater degree of planarity and mechanical stability to PCBs.

One disadvantage of plated through hole connections, however, is their behavior when conducting high frequency signals. Basically, as the frequency of the signal traveling through the plated through hole connection increases, the resistance of the plated through hole connection increases. Since the overall trend in the electronics industry usually involves increasing the speed (or frequency) at which the various electronics devices operate, the high frequency disadvantages of plated through hole connections become more and more pronounced with each generation of electronic devices.

BRIEF SUMMARY

Methods and apparatuses for affecting the frequency behavior of connections within a printed circuit board or an integrated circuit are disclosed. Some embodiments include a printed circuit board comprising, a plurality of conductive layers each comprising at least one conductive pad, where each conductive pad on the conductive layers includes a vacancy, and an insulating material disposed about the conductive layers such that the vacancies are at least partially filled with the insulating material.

BRIEF DESCRIPTION OF THE DRAWINGS

For a detailed description of exemplary embodiments of the invention, reference will now be made to the accompanying drawings in which:

FIGS. 3A-F depict exemplary vacancy patterns;

NOTATION AND NOMENCLATURE

Certain terms are used throughout the following description and claims to refer to particular system components. As one skilled in the art will appreciate, computer companies refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection is through a direct electrical connection, or through an indirect electrical connection by way of other devices and connections.

Additionally, the term "pad," as used herein, is intended to refer to metallic or semi-metallic portions that exist on conductive layers. The overall shape of the periphery of these pads is preferably substantially circular, but other shapes, such as a square, rectangle, and/or any polygon is employed. While pads are preferably coupled to traces, pads exist on conductive layers without being coupled to traces. Pads that are not coupled to traces are referred to as "dummy pads." Although dummy pads do not provide a path for electrical current to flow, these dummy pads do provide greater overall mechanical strength.

The term "pad stack" is intended to refer to a group of coaxially oriented pads. Pads within a pad stack preferably are coupled to each other, although in some embodiments no coupling is desired.

DETAILED DESCRIPTION

The following discussion is directed to various embodiments of the invention. Although one or more of these embodiments is preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
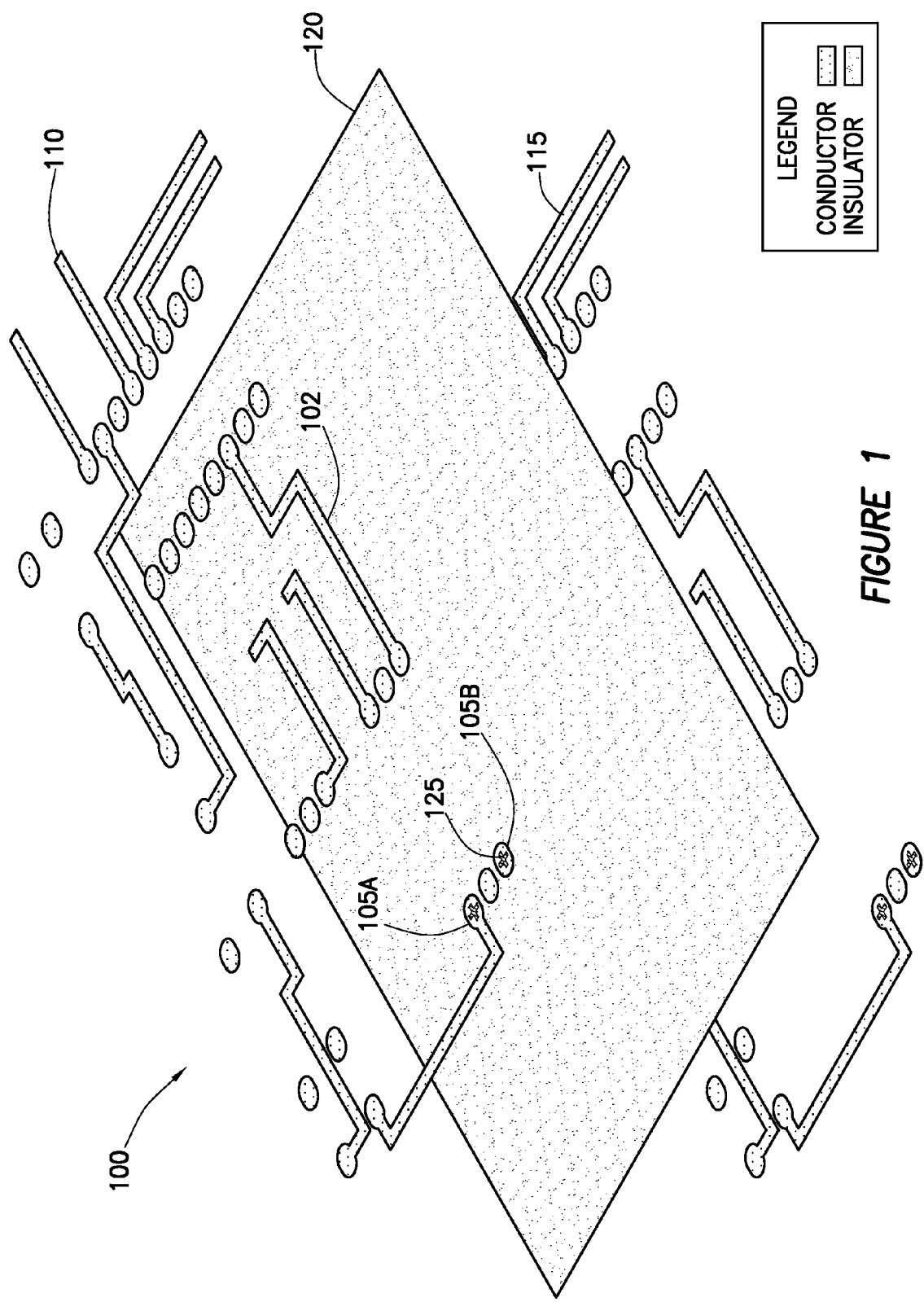
FIG. 1 depicts an exploded view of an exemplary printed circuit board.

In accordance with various embodiments of the present invention, devices and methods for improving the frequency behavior of plated through hole connections are disclosed. FIG. 1 depicts an exploded view of an exemplary printed circuit board (PCB) 100 including conductive layers 110 and 115 and an insulating layer 120. Although a limited number of conductive and insulating layers are depicted for ease of discussion, it will be appreciated that numerous layers are possible. A legend is provided on FIG. 1, as well as the other figures, to indicate the insulating and conductive portions depicted.

Conductive layers 110 and 115 are generally made of a metal with a high electrical conductivity, such as copper (Cu) or tungsten (W). These metallic conductive layers are used to provide power and ground planes for PCB 100, or alternatively, they are patterned to form conductive paths, such as traces 102 and pads 105A-B, which enable signals to flow from one point of PCB 100 to another.

Traces 102 and pads 105A-B are organized or patterned using various methods. For example, patterning occurs by way of chemical vapor deposition (CVD), through a series of etching steps, or by printing a layer of metallic ink using an ink-jet printer.

Pads 105A-B couple to traces 102, as is the case with pad 105A, or they stand alone on the conductive layer 110, as is the case with pad 105B. Thus, pad 105A couples the trace to which it is attached to additional conductive layers, such as conductive layer 115.

Insulating layer 120 is preferably disposed about conductive layer 110 to surround traces 102 and pads 105A-B and preventing them from making contact with each other. Insulating layers, such as insulating layer 120, are generally made of a ceramic, such as alumina, or other dielectric material, such as TEFLON® (by Du Pont), or FR-4—a glass epoxy resin widely used in PCB fabrication. Suitable vendors of FR-4 include Nelco, Arlon, Allied Signal, and Gore.

Initially, conductive layer 110 is patterned into conductive paths, such as traces 102 and pads 105A-B. According to preferred embodiments, pads 105A-B include vacancies 125. As will be described in further detail below, vacancies 125 are arranged in various patterns to enhance their high frequency behavior. When the insulating layer 120 is disposed about the conductive layer 110, vacancies 125 preferably fill with the dielectric material creating a pad with a dielectric center portion. A pad stack is then created by arranging the pads coaxially as illustrated in FIG. 2.

Figure 2:
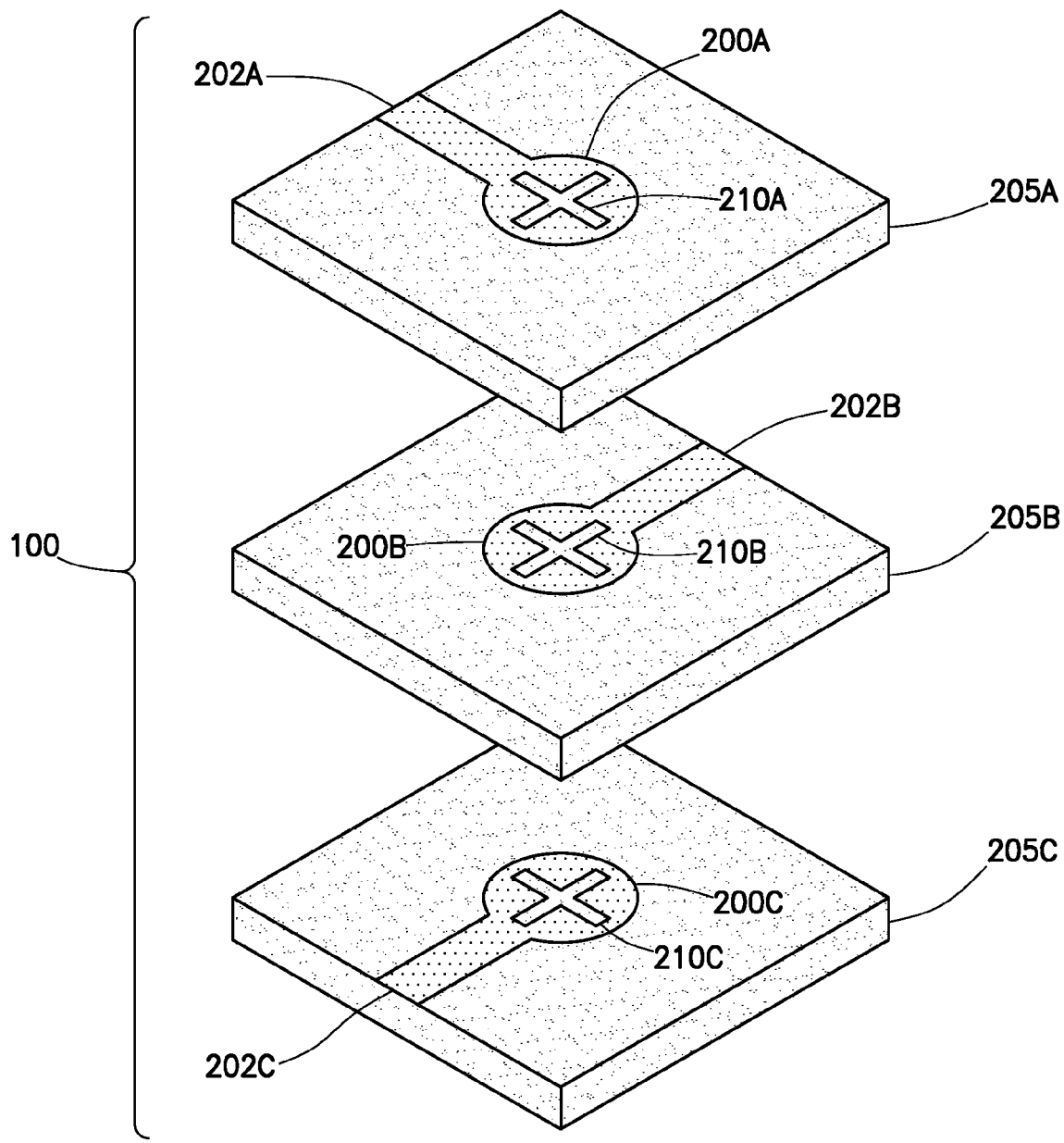
FIG. 2 depicts an exemplary pad stack.

Referring to FIG. 2, pads 200A-C are shown coupled to traces 202A-C. As can be appreciated by examination of FIG. 2, traces 202A-C each proceed in different directions to allow for connections between various area of PCB 100. Insulating layers 205A-C are preferably disposed about pads 200A-C and fill the vacancies 210A-C with dielectric material. Ultimately, if a connection is desired between pads 200A-C, a hole is drilled through the dielectric material. As stated above, the method of drilling includes mechanical drilling with a drill bit, as well as creating the hole with a laser. In any case, a hole of predetermined size is constructed through each desired layer of the multiple layers of PCB 100. The holes in each layer preferably leave an open cavity or barrel that is then plated with a conductive or superconductive material to provide a way to convey an electrical signal from trace 202A to trace 202C, for example. Suitable coating metals include Cu, Gold (Au), Silver (Ag), Aluminum (Al), or combinations thereof.

FIGS. 3A-F depict pads 300-322 including patterns for dielectric filled vacancies according to the various embodiments. Specifically, FIG. 3A illustrates a pad 300 including a cross-shaped vacancy, FIG. 3B illustrates a pad 305 including a triangle-shaped vacancy, FIG. 3C illustrates a pad 310 including a hexagonal-shaped vacancy, FIG. 3D illustrates a pad 315 including a diamond-shaped vacancy, FIG. 3E illustrates a pad 320 including a multipoint star-shaped vacancy, and FIG. 3F illustrates a pad 322 including a circular shaped vacancy. Although FIGS. 3A-F show specific vacancy patterns, any geometric shape is possible. Furthermore, although a specific vacancy pattern is used as an example throughout this disclosure, this disclosure should not be interpreted as limited to any particular vacancy pattern.

Each vacancy preferably defines an interior diameter and an exterior diameter, which determines the range of hole sizes that are drilled. For example, referring to FIG. 3A, a hole is drilled in pad 300 such that the diameter of the hole drilled makes contact with the interior edges 325 of the dielectric filled vacancy while not making contact with the outer edges 330 of the vacancy. Vacancy patterns, such as those shown in FIGS. 3A-F, are believed to enhance high frequency behavior of electrical connections on PCB 100, and are particularly useful in accounting for skin effect behavior.

Figure 4:
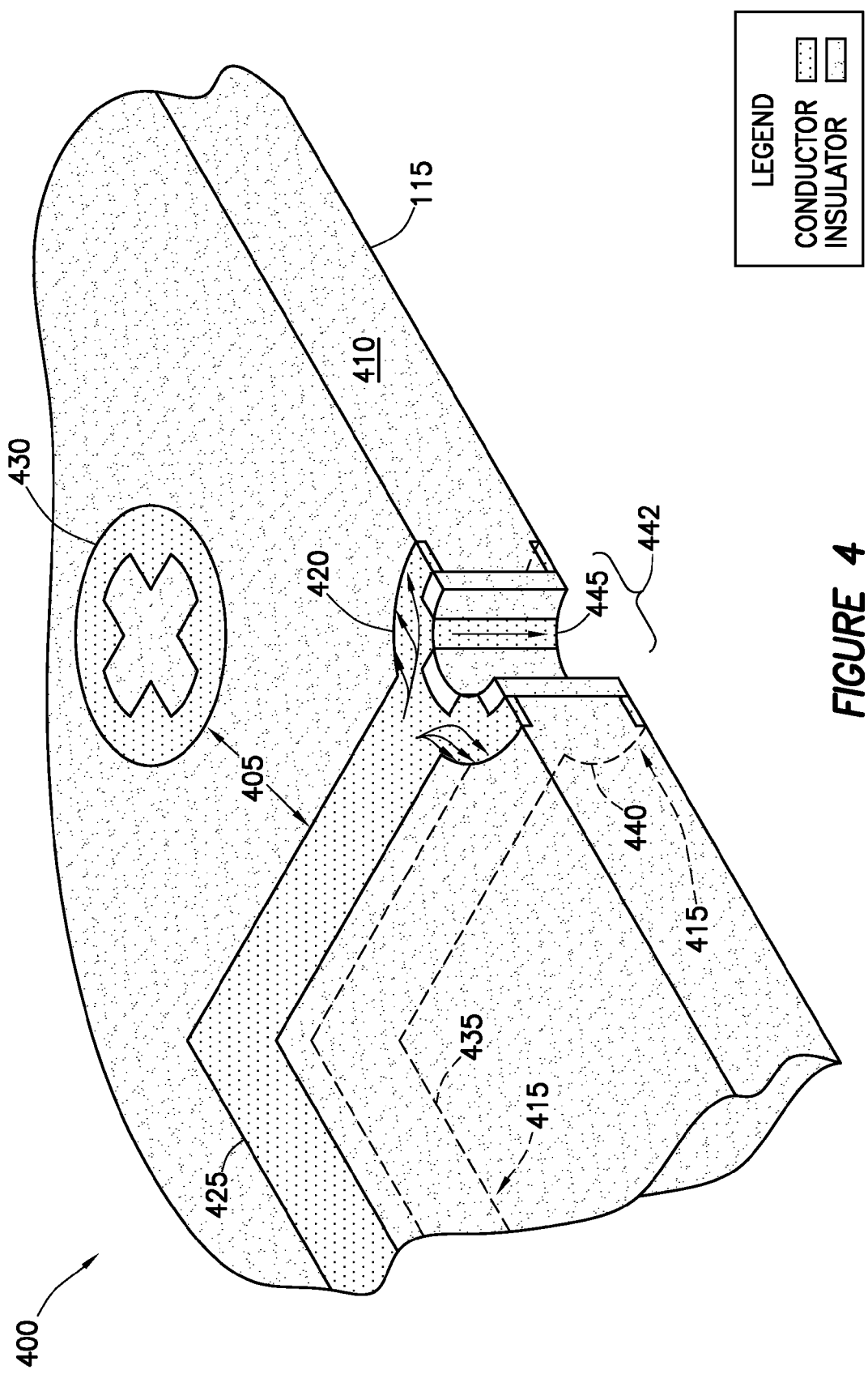
FIG. 4 depicts a cross section of an exemplary printed circuit board.

FIG. 4 represents a cross section of an exemplary PCB 400 including a conductive layer 405 on an insulating layer 410, and a second conductive layer 415 (shown in phantom to indicate relative position). Conductive layer 405 is patterned to include a pad 420 coupled to a trace 425 as well as a dummy pad 430. The dielectric filled vacancy of dummy pad 430 is intact (i.e., has not been drilled through) because it does not provide electrical connection to other areas of PCB 400.

Conductive layer 415 is patterned to include a trace 435 coupled to a pad 440 that is coaxially oriented with respect to pad 420. Pads 420, 430, and 440 each include a cross-shaped vacancy filled with dielectric material. The cross-shaped vacancy is readily apparent in FIG. 4 in pad 430, while the cross-shaped vacancy of pads 420 and 440 have been drilled though. A longitudinal cavity 442 is formed in PCB 400 by drilling a hole through the dielectric filled vacancies at the center of coaxially oriented pads 420 and 440 respectively. The diameter of cavity 442 is related to the diameter of the holes drilled through the dielectric filled vacancies of pads 420 and 440. In order to provide an electrical connection between pads 420 and 440, the diameter of the hole drilled to create cavity 442 is preferably larger than the circular path defined by the interior edges of the cross-shaped vacancy (see, e.g., interior edges 325 illustrated in FIG. 3A). Additionally, in order to provide enhanced frequency response of the electrical connection between pads 420 and 440, the diameter of the hole drilled to create cavity 442 is preferably smaller than that circular path defined by the outer edges of the cross-shaped vacancy (see, e.g., outer edges 330 illustrated in figure 3A). A suitable range of diameters of at least one embodiment includes 10-25 mils.

Once cavity 442 is formed, it is preferably plated with metal to form longitudinal channels 445 that extend along the walls of cavity 442 and couple to pads 420 and 440. Specifically, the cavity 442 being drilled with a diameter larger than the path defined by the interior edges of the vacancy and smaller than the path defined by the outer edges of the vacancy exposes areas of insulation between areas of dielectric vacancy not drilled away to create the cavity 442, and such areas may be plated with metal to form channels 445 along the inside walls of cavity 442 connecting pads 420 and 440. Electrical signals are then conveyed from trace 425 to trace 435 by way of the combination of channels 445 and pads 420 and 440 thereby conducting current down the inside of the cavity rather than the outer surfaces of the pads, overcoming the electrical current distribution changes referred to as the skin effect. Briefly put, as the frequency of a signal increases, the skin effect causes the amount of electrical current to be greater near the surface of a conductor than at the interior of a conductor. By providing channels down the inside of the cavity drilled between dielectric filled vacancies in coaxially located pads, the result of the skin effect is alleviated for high frequency signals.

Referring still to FIG. 4, the dashed arrows in the combination of pad 420 and channels 445 represent the path or electrical current taken due to the skin effect. Since the skin effect causes the electrical signal to travel near the surface of the conductors, higher frequency electrical signals travel along the top surface of pad 420, over the edge of pad 420, and back along the bottom surface of pad 420. Upon reaching the bottom surface of pad 420, the electrical signal then passes along the channels 445 to pad 440.

Traversing such a path usually increases the resistance and attenuates the high frequency signal. By introducing the dielectric filled vacancies at each pad 420 and 440, and creating a shorter current path for the high frequency signal through channels in the cavity drilled between dielectric filled vacancies in two coaxially located pads, the signal integrity is improved.

Figure 5:
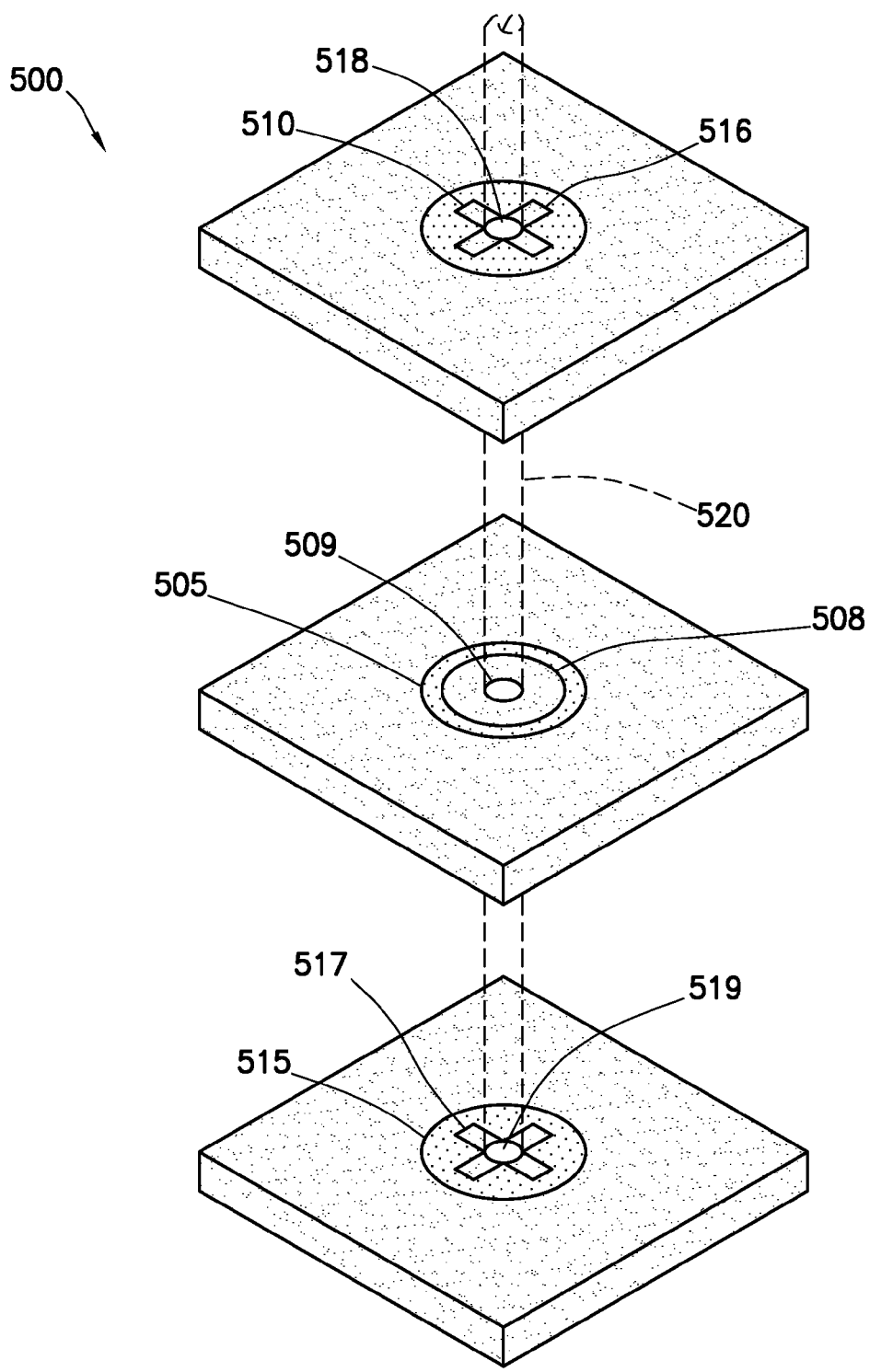
FIG. 5 depicts an exploded view of a printed circuit board including a dummy pad according to an embodiment of the present invention.

FIG. 5 illustrates an exploded view of PCB 500, which includes a dummy pad 505 having a donut-shaped vacancy 508. Donut-shaped vacancy 508 is formed by drilling a hole 509 through a pad with a circular vacancy (e.g., pad 322 shown in FIG. 3F). Dummy pad 505 preferably is coaxially oriented between pads 510 and 515, which includes vacancies 516 and 517. Cross-shaped vacancy 516 and donut-shaped vacancy 517 further includes holes 518 and 519 drilled through them respectively. The diameter of hole 509 varies, but preferably it is at least greater than the maximum diameter of holes 518 and 519.

A cavity 520 exists substantially at the center of the pad stack formed by the combination of pads 505, 510, and 515. Once plated with a conductive material, cavity 520 preferably makes electrical connection with pads 510 and 515, but not with dummy pad 505 because the diameter of the hole 509 is greater than the diameter of holes 518 and 519. In this manner, dummy pad 505 provides mechanical stability without electrically coupling to adjacent pads 510 and 515 in the pad stack. Since dummy pad 505 is not coupled to the pad stack, the path length traveled by an electrical signal is shorter, and as a result, the signal integrity is increased while still providing mechanical stability for PCB 500.

Given that higher frequency signals travel on the surface of a conductive plane due to the skin effect, large conductive planes significantly increase the path length traveled by a signal, causing decreased signal integrity. Accordingly, dummy pad 505 is particularly useful when implemented as part of a large continuous conductive layer, such as a power or ground plane. Similarly, dummy pad 505 is used as part of a pad stack containing many pads where only the top and bottom pads are non-dummy pads.

Figure 6:
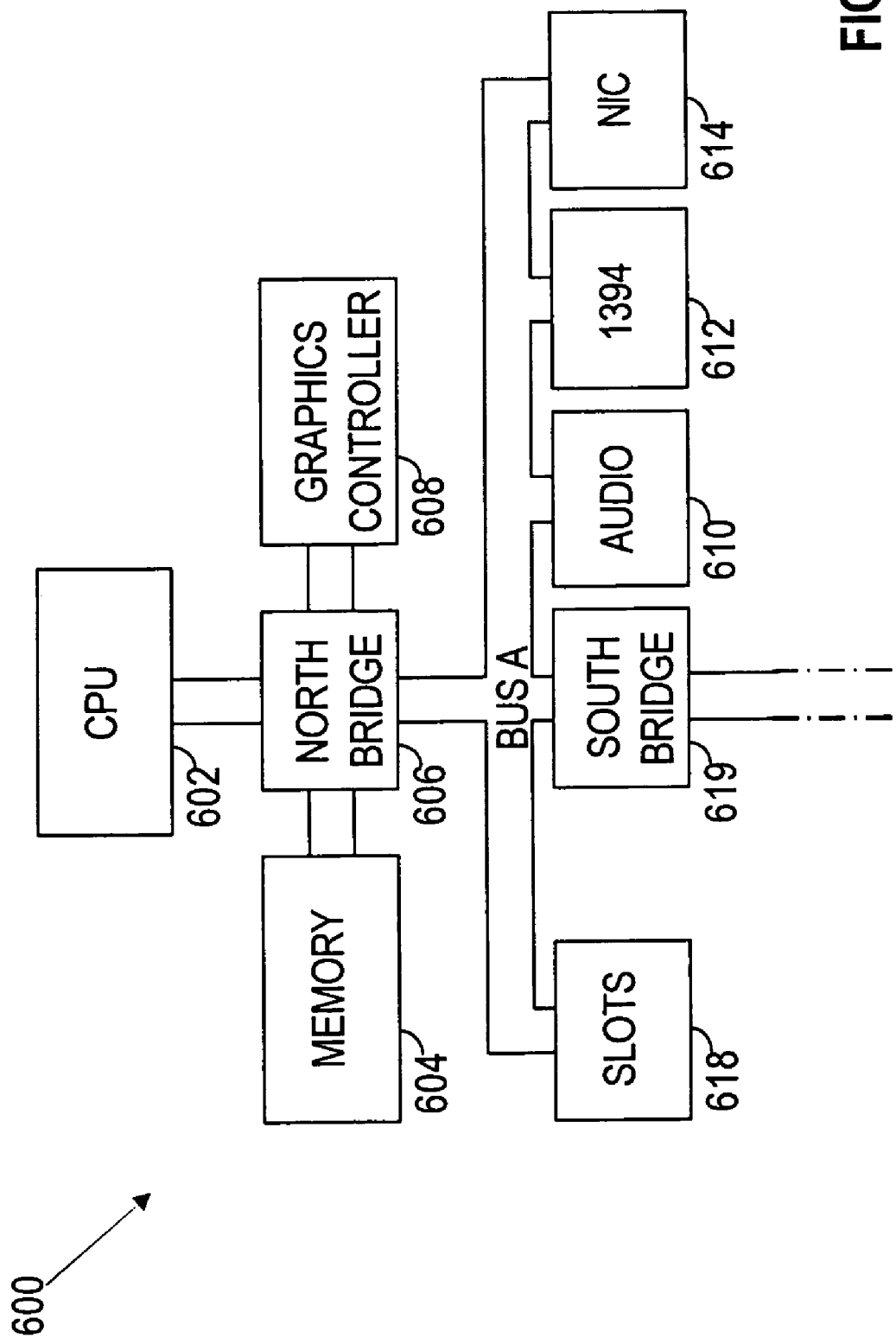
FIG. 6 illustrates an exemplary computer system.

FIG. 6 illustrates an exemplary computer system 600 that is integrated on a PCB constructed according to the preferred embodiments. The computer system of FIG. 6 includes a central processing unit (CPU) 602 that is electrically coupled to a bridge logic device 606 by a CPU bus. The bridge logic device 606 is sometimes referred to as a "North bridge." The North bridge 606 electrically couples to a main memory array 604 by a memory bus, and further electrically couples to a graphics controller 608 by an advanced graphics processor (AGP) bus. The North bridge 606 couples CPU 602, memory 604, and graphics controller 608 to the other peripheral devices in the system through, for example, a primary expansion bus (BUS A) such as a PCI bus or an EISA bus. Various components that operate using the bus protocol of BUS A resides on this bus, such as an audio device 610, an IEEE 1394 interface device 612, and a network interface card (NIC) 614. These components are integrated onto the PCB, or they are plugged into expansion slots 618 that are connected to BUS A. If other secondary expansion buses are provided in computer system 600, another bridge logic device 619 is used to electrically couple the primary expansion bus, BUS A, to a secondary expansion bus (BUS B). This bridge logic 619 is sometimes referred to as a "South bridge."

The above discussion is meant to be illustrative of the principles and various embodiments of the present invention. Numerous variations and modifications will become apparent to those skilled in the art once the above disclosure is fully appreciated. For example, the enhanced high frequency characteristics also affect the resistance of the conductive path when conveying a DC signal, and therefore, balancing the behavior of the conductive path at high frequencies versus the behavior of the conductive path when carrying a DC signal is desirable. It is intended that the following claims be interpreted to embrace all such variations and modifications.

What is claimed is:

1. A printed circuit board (PCB), comprising:
 a plurality of conductive layers;
 each conductive layer comprising at least one conductive pad;
 each conductive pad further comprising a vacancy filled by a dielectric material:
 a cavity formed through at least two vacancies in two respective conductive pads;
 wherein the cavity is plated with a conductive material, thereby forming at least one conductive channel disposed longitudinally along the inside of the cavity to conduct a signal between the conductive pads.

2. The PCB of claim 1, further comprising a stack of conductive pads coaxially oriented with respect to each other.

3. The PCB of claim 2, further comprising top and bottom pads in the stack, wherein only the top and bottom pads are non-dummy pads.

4. The PCB of claim 2, further comprising conductive traces coupled to each conductive pad.

5. The PCB of claim 1, wherein the conductive channels convey substantially all of an electrical signal flowing between the conductive pads, thereby reducing the skin effect.

6. The PCB of claim 5, wherein each vacancy has a shape chosen from the group consisting of a cross, a triangle, a circle, a multi-pointed star, a diamond, and a hexagon.

7. The PCB of claim 5, wherein the conductive material in the cavity is chosen from the group consisting of Copper (Cu), Gold (Au), Silver (Ag), and Aluminum (Al).

8. The PCB of claim 5, wherein the dielectric material is chosen from the group consisting of TEFLON® and FR-4.

9. The PCB of claim 1, wherein the vacancy includes an interior diameter and an exterior diameter; and wherein the cavity formed through the at least two vacancies is larger than the interior diameter.

10. The PCB of claim 1, wherein the vacancy includes an interior diameter and an exterior diameter; and wherein the cavity formed through the at least two vacancies is smaller than the exterior diameter.

11. A computer system, comprising:
 a processor;
 a system memory coupled to said processor through a PCB;, wherein the PCB comprises:
 a plurality of conductive layers;
 each conductive layer comprising at least one conductive pad;
 each conductive pad further comprising a vacancy filled by a dielectric material;
 a cavity formed through at least two vacancies in two respective conductive pads;

wherein the cavity is plated with a conductive material, thereby forming at least one conductive channel disposed longitudinally along the inside of the cavity to conduct a signal between the conductive pads.

12. The computer system of claim 11, wherein the shape of the vacancy is chosen from the group consisting of a cross, a triangle, a circle, a multi-sided star, a diamond, and a hexagon.

13. The computer system of claim 12, wherein the dielectric material is chosen from the group consisting of TEFLON® and FR-4.

14. The computer system of claim 12, wherein the vacancy includes an interior diameter and an exterior diameter; and wherein the cavity formed through the at least two vacancies is larger than the interior diameter.

15. The computer system of claim 12, wherein the vacancy includes an interior diameter and an exterior diameter; and wherein the cavity formed through the at least two vacancies is smaller than the exterior diameter.

* * * * *

UNITED STATES PATENT AND TRADEMARK OFFICE
CERTIFICATE OF CORRECTION

| | | |
|---|---|---|
| PATENT NO. | : 7,238,892 B2 | Page 1 of 1 |
| APPLICATION NO. | : 11/188481 | |
| DATED | : July 3, 2007 | |
| INVENTOR(S) | : Karl J. Bois et al. | |

It is certified that error appears in the above-identified patent and that said Letters Patent is hereby corrected as shown below:

On the Title page, in Item (56), under "Foreign Patent Documents", in column 2, line 1, delete "JP  0200401455  A  *   1/2004" and
insert -- JP    02004014559  A  *    1/2004 --, therefor.

In column 4, line 24, after "drilled" delete "though" and insert -- through --, therefor.

In column 4, line 65, after "path" delete "or" and insert -- of --, therefor.

In column 6, line 21, in Claim 1, delete "material:" and insert -- material; --, therefor.

In column 6, line 36, in Claim 5, delete "channels" and insert -- channel --, therefor.

In column 6, line 60, in Claim 11, delete "PCB;," and insert -- PCB, --, therefor.

Signed and Sealed this

Fifth Day of August, 2008

JON W. DUDAS
*Director of the United States Patent and Trademark Office*